(12) United States Patent
Mihara et al.

(10) Patent No.: US 10,689,550 B2
(45) Date of Patent: *Jun. 23, 2020

(54) ELECTRICALLY CONDUCTIVE COMPOSITION

(71) Applicant: FURUKAWA ELECTRIC CO., LTD., Tokyo (JP)

(72) Inventors: Naoaki Mihara, Tokyo (JP); Noriyuki Kirikae, Tokyo (JP); Jirou Sugiyama, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 128 days.

This patent is subject to a terminal disclaimer.

(21) Appl. No.: 15/682,501

(22) Filed: Aug. 21, 2017

(65) Prior Publication Data

US 2017/0369746 A1 Dec. 28, 2017

Related U.S. Application Data

(63) Continuation of application No. PCT/JP2016/071556, filed on Jul. 22, 2016.

(30) Foreign Application Priority Data

Aug. 3, 2015 (JP) .................................. 2015-153223

(51) Int. Cl.
*C09J 9/02* (2006.01)
*C09J 163/00* (2006.01)
(Continued)

(52) U.S. Cl.
CPC ............ *C09J 9/02* (2013.01); *C08G 73/1082* (2013.01); *C08G 73/128* (2013.01); *C08K 3/10* (2013.01);
(Continued)

(58) Field of Classification Search
CPC ....................................................... H01B 1/02
See application file for complete search history.

(56) References Cited

U.S. PATENT DOCUMENTS

2008/0200582 A1* 8/2008 Craciun ........... B29D 11/00442
522/166
2009/0059349 A1* 3/2009 Yamamoto .............. G02F 1/167
359/296
(Continued)

FOREIGN PATENT DOCUMENTS

JP H10-261319 A 9/1998
JP 2002-307188 A 10/2002
(Continued)

OTHER PUBLICATIONS

Partial translation of Pat. Pub. JP 2014-196437, paragraph 48. (Year: 2014).*

(Continued)

*Primary Examiner* — William D Young
(74) *Attorney, Agent, or Firm* — Oliff PLC (57) ABSTRACT

A composition exhibits excellent heat resistance and mounting reliability when bonding a semiconductor power element to a metal lead frame, which is also free of lead and thereby places little burden on the environment. An electrically conductive composition contains at least a sulfide compound represented by R—S—R' (wherein R is an organic group containing at least carbon; R' is an organic group that is the same as or different from R; and R and R' may be bonded to each other to form a so-called cyclic sulfide) and metal particles containing at least Cu, Sn or Ni as its essential component. Further, a conductive paste and a conductive bonding film each are produced using the electrically conductive composition. A dicing die bonding film is obtained by bonding the conductive bonding film with an adhesive tape.

13 Claims, 5 Drawing Sheets

(51) Int. Cl.
H01B 1/22 (2006.01)
C08G 73/10 (2006.01)
C09J 7/35 (2018.01)
C09J 11/02 (2006.01)
H01L 23/00 (2006.01)
C08G 73/12 (2006.01)
C09J 7/10 (2018.01)
C09J 201/00 (2006.01)
C09J 179/08 (2006.01)
H01L 21/52 (2006.01)
C09J 11/04 (2006.01)
C09J 11/06 (2006.01)
C08K 3/10 (2018.01)
H01L 21/683 (2006.01)
C08K 5/372 (2006.01)
C08K 3/08 (2006.01)
C08K 5/375 (2006.01)
C08K 5/45 (2006.01)

(52) U.S. Cl.
CPC . *C09J 7/10* (2018.01); *C09J 7/35* (2018.01); *C09J 11/02* (2013.01); *C09J 11/04* (2013.01); *C09J 11/06* (2013.01); *C09J 163/00* (2013.01); *C09J 179/08* (2013.01); *C09J 179/085* (2013.01); *C09J 201/00* (2013.01); *H01B 1/22* (2013.01); *H01L 21/52* (2013.01); *H01L 21/6836* (2013.01); *H01L 24/27* (2013.01); *H01L 24/29* (2013.01); *H01L 24/83* (2013.01); *C08K 3/08* (2013.01); *C08K 5/372* (2013.01); *C08K 5/375* (2013.01); *C08K 5/45* (2013.01); *C08K 2003/085* (2013.01); *C08K 2003/0862* (2013.01); *C08K 2201/001* (2013.01); *C09J 2203/326* (2013.01); *C09J 2205/102* (2013.01); *C09J 2463/00* (2013.01); *C09J 2479/08* (2013.01); *H01L 24/05* (2013.01); *H01L 24/45* (2013.01); *H01L 24/48* (2013.01); *H01L 24/73* (2013.01); *H01L 24/92* (2013.01); *H01L 2221/6839* (2013.01); *H01L 2221/68327* (2013.01); *H01L 2221/68381* (2013.01); *H01L 2224/04026* (2013.01); *H01L 2224/05644* (2013.01); *H01L 2224/27436* (2013.01); *H01L 2224/2919* (2013.01); *H01L 2224/2929* (2013.01); *H01L 2224/29209* (2013.01); *H01L 2224/29211* (2013.01); *H01L 2224/29218* (2013.01); *H01L 2224/29224* (2013.01); *H01L 2224/29239* (2013.01); *H01L 2224/29244* (2013.01); *H01L 2224/29247* (2013.01); *H01L 2224/29255* (2013.01); *H01L 2224/29266* (2013.01); *H01L 2224/29309* (2013.01); *H01L 2224/29311* (2013.01); *H01L 2224/29318* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29366* (2013.01); *H01L 2224/32245* (2013.01); *H01L 2224/45124* (2013.01); *H01L 2224/48091* (2013.01); *H01L 2224/48247* (2013.01); *H01L 2224/73265* (2013.01); *H01L 2224/8384* (2013.01); *H01L 2224/83191* (2013.01); *H01L 2224/83851* (2013.01); *H01L 2224/83855* (2013.01); *H01L 2224/83906* (2013.01); *H01L 2224/92247* (2013.01); *H01L 2924/0665* (2013.01); *H01L 2924/0705* (2013.01); *H01L 2924/13055* (2013.01); *H01L 2924/13091* (2013.01); *H01L 2924/181* (2013.01)

(56) References Cited

U.S. PATENT DOCUMENTS

| | | | | |
|---|---|---|---|---|
| 2012/0077401 | A1* | 3/2012 | Kotake | B32B 27/38 442/147 |
| 2014/0120356 | A1 | 5/2014 | Shearer et al. | |
| 2016/0304728 | A1 | 10/2016 | Kageyama | |
| 2017/0309948 | A1* | 10/2017 | Azami | H01M 4/13 |

FOREIGN PATENT DOCUMENTS

| | | | |
|---|---|---|---|
| JP | 2004-189954 | A | 7/2004 |
| JP | 2004-355933 | A | 12/2004 |
| JP | 2007-152385 | A | 6/2007 |
| JP | 2009-209246 | A | 9/2009 |
| JP | 2010-221260 | A | 10/2010 |
| JP | 2014-049621 | A | 3/2014 |
| JP | 2014-196437 | A | 10/2014 |
| JP | 5989928 | B1 | 9/2016 |
| WO | 2009/057530 | A1 | 5/2009 |
| WO | 2010/046996 | A1 | 4/2010 |
| WO | 2015/093597 | A1 | 6/2015 |

OTHER PUBLICATIONS

Nov. 22, 2018 Extended Search Report issued in EP Patent Application No. 16832802.9.
Oct. 4, 2016 International Search Report issued in International Patent Application No. PCT/JP2016/071556.

* cited by examiner

ELECTRICALLY CONDUCTIVE COMPOSITION

TECHNICAL FIELD

The present invention relates to an electrically conductive composition. More specifically, the present invention relates to an electrically conductive paste, an electrically conductive adhesive composition, an electrically conductive adhesive film composed thereof, as well as a dicing die bonding film that is obtained by bonding a pressure-sensitive adhesive tape thereto.

BACKGROUND ART

Conventionally, when bonding semiconductor power devices such as IGBT (Insulated Gate Bipolar Transistor) and MOS-FET (Field Effect Transistor) on to metal lead frames, lead-free solder has been widely used; however, in recent years, the toxicity of lead is being considered problematic. Further, in recent years, due to the growing requirements for higher-density energy control, studies on power devices that utilize wide-gap semiconductors such as SiC and GaN, which show resistance at junction temperatures of 200° C. or higher, are moving along. However, because the eutectic melting point of lead solder is low, the lack of heat resistance at the joint has been an obstacle.

In accordance with the above background, various types of lead-free solders that do not contain lead have appeared. Among such lead-free solders, high-melting point solder such as AuGe is attracting attention as a bonding material for wide-gap semiconductor devices. However, the high price of the material and the rise in mounting temperature causes the process cost to rise, thus, hindering its popularization. Further, since most lead-free solders exhibit lower wettability than lead solder, the solder does not spread on the die pad part, causing parts of the die such as the corner to lack solder. Thus, the risk of bonding defects occurring at such corner is a problem. Since the wettability of lead-free solder tends to deteriorate with the rise in melting point, it is difficult to achieve both heat resistance and mounting reliability.

In order to solve the above problem, studies on diffusive sintering-type solder, such as Cu/Sn-based solder, is underway. Although such diffusive sintering-type solders show low melting point at mounting, since the melting point increases irreversibly after the diffusive sintering reaction, it is more advantageous than conventional lead-free solders in achieving both heat resistance and mounting reliability. However, even in diffusive sintering-type solders, because the wettability is slightly inferior than lead solder, for the bonding of large-area devices such as those of 5 mm×5 mm or more, there is still the risk of lacking solder. Further, since the sintered body is hard and brittle, and exhibit low stress relaxation property, which causes low heat-resisting fatigue property, there is the disadvantage of shorter device life.

Other than the above-described lead-free solder, Ag pastes are being used, but the drastic increase in material cost and contamination by the migration of Ag ion are seen as problems.

Further, in general, many lead solders and lead-free solders often contain flux such as carboxylic acid and alcohol for the purpose of removing metal oxide films. However, it has been known that such flux components tend to absorb moisture and bleed out, and the absorbed moisture and the flux that bleed out both have adverse effects on the anti-reflow reliability after moisture absorption (MSL) in the bonded package of semiconductor devices. Thus, conventionally, flux rinsing was said to be necessary after soldering, but such labor and the processing of waste fluid is being viewed as problematic. Nevertheless, if the carboxylic acid and/or alcohol is not added, in order to decrease moisture-absorption and bleed-out, the oxide film removability becomes insufficient, causing the appearance of electric conductivity and other properties to be difficult.

Further, in Patent Document 4, in the adhesive composition that utilizes silver as an inorganic filer, which is used in semiconductor devices, the use of thiols and thioethers is disclosed. However, silver is highly expensive and is likely to undergo ion migration, and thus there is a large risk of unintentional short-circuiting between electrodes.

RELATED ART

Patent Documents

Patent Document 1: JP2002-A-307188
Patent Document 2: JP2007-A-152385
Patent Document 3: US2014/120356 A1
Patent Document 4: JP2014-A-196437

SUMMARY

The purpose of the present invention is to provide a means that exhibit excellent heat resistance and mounting reliability, when bonding a semiconductor power device on to a metal lead frame, which is also lead-free and places little burden on the environment.

As a result of keen investigation, the applicants arrived at the invention of an electrically conductive composition that solves the above-described problems, as well as an electrically conductive paste that utilize it, an electrically conductive adhesive film, and a dicing die bonding film.

That is, the present invention relates to a n electrically conductive composition, which comprises a sulfide compound expressed by the following general formula (1) and metal particles that contain at least one of Cu, Sn or Ni as essential components. (R is an organic group that contains at least carbon, R' is an organic group that is the same as or different from R. Note that R and R' may be bonded.)

General Formula (1)

R—S—R'  [Chemical Formula 1]

Here, the sulfide compound is preferably a compound that contains two or more sulfur atoms in one molecule.

Further, it is preferable that the sulfide compound is a compound that contains at least one of the following: vinyl group, acryloyl group, primary amino group, secondary amino group, phenolic hydroxyl group, thiol group, hydrosilyl group, hydroboron group, maleate group, maleic amide group, maleic imide group.

Further, it is preferable that the number average molecular weight of the sulfide compound is 200 or more.

Further, the present invention relates to an electrically conductive composition, which comprises at least the sulfide compound, metal particles, and a thermosetting resin.

Here, it is preferable that the thermosetting resin comprises a maleic imide compound that contains two or more units of imide groups in one molecule.

Further, it is preferable that the maleic imide compound contains a structure derived from an aliphatic amine of C10 or more.

Furthermore, it is preferable that the number average molecular weight of the maleic imide compound is 3000 or more.

Further, it is also preferable that the thermosetting resin is an epoxy resin.

Furthermore, it is preferable that at least part of the metal particles contains one of Cu, Ag, Au, Ni, or Sn.

Further, it is preferable that the metal particles are a mixture of two or more metals, which includes a combination that is capable of mutually forming intermetallic compounds.

Furthermore, it is preferable that at least two of the two or more metal particles are selected from Cu, Ag, Ni, Ti, Al, Sn, Zn, Au, and In.

Further, the present invention relates to the above-described electrically conductive composition, which comprises at least one endothermic peak observed by DSC (Differential Scanning calorimetry) at 100° C. to 250° C. prior to sintering, which becomes unobservable after sintering.

Moreover, the present invention relates to an electrically conductive adhesive composition, which utilizes the above-described electrically conductive composition.

Further, the present invention relates to an electrically conductive adhesive film, which is obtained by forming the conductive adhesive composition in film form through application on a substrate and drying, extruding, and other methods.

In addition, the present invention relates to a dicing die bonding film, which is obtained by bonding the electrically conductive adhesive film with a pressure-sensitive adhesive tape.

Effect of the Invention

By using the electrically conductive paste that utilizes the electrically conductive composition of the present invention, the electrically conductive adhesive film, or the dicing die bonding film obtained by combining it with a dicing tape, an inexpensive means that places little burden on the environment for electrically bonding power semiconductors on to metal lead frames and such is achieved. The means exhibits excellent heat resistance after sintering while enabling mounting at low temperature, does not cause solder-lacking defects, and shows excellent thermal fatigue resistance and reflow-resistance after moisture absorption, even without a flux-rinsing process.

DESCRIPTION OF SOME EMBODIMENTS

The electrically conductive composition of the present invention comprises at least a sulfide compound expressed by the following general formula (1) and metal particles that contain at least one of Cu, Sn or Ni as essential components. (R is an organic group that contains at least carbon, R' is an organic group that is the same as or different from R. Note that R and R' may be bonded, namely, the sulfide compound may be a so-called cyclic sulfide.)

General Formula (1)

R—S—R'  [Chemical Formula 1]

Here, the metal particles are responsible for the electric conductivity and thermal conductivity, while the sulfide compound expressed by general formula (1) functions as a so-called "flux" by removing the oxide film on the surface of the metal particles, thereby assisting in their function. As the metal particles, metals that tend to oxidize such as Cu, Sn, and Ni particularly show remarkable effects. Further, these metals are inexpensive and hardly undergo ion migration, and are thus preferable.

(Sulfide Compound)

The use of the sulfide compound expressed by general formula (1) as the flux is preferable in that it shows extremely low moisture absorptivity compared to carboxyl acids or alcohols, which were conventionally used as flux.

Further, it is preferable that the sulfide compound is a compound that contains two or more sulfur atoms in one molecule, from the point of enhancing reducibility of the metal oxide film.

Further, it is preferable that the sulfide compound is a compound that contains at least one of the following functional groups: vinyl group, acryloyl group, primary amino group, secondary amino group, phenolic hydroxyl group, thiol group, hydrosilyl group, hydroboron group, maleate group, maleic amide group, maleic imide group. Further, from the point of ease in hardening, it is preferable that the sulfide compound is a compound that contains an acryloyl group.

Further, from the point of suppressing bleed-out at the time of sintering and so on, the number average molecular weight of the sulfide compound is preferably 200 or more. By having the above molecular weight and by hardening, bleed-out can be minimized, thereby preventing the decline of package reliability due to contamination of the lead frame. Further, since the amount of loss of the sulfide flux due to bleed-out is extremely small, the reducibility of the flux can be put to effective use at nearly 100%.

As specific examples of such sulfide compounds, 2-methylthiopheno thiazine, bis(4-methacryloylthiopheyl)sulfide, and bis(2-methacroylthioethyl)sulfide can be listed.

Such acryloyl sulfide compounds also function as thermosetting resin components that are capable of forming copolymers with maleimide resins. By using flux components that hardly absorbs moisture and shows low bleed-out due to its sufficiently large molecular weight and its polymerizing property, while containing no or very little alcohol or carboxylic acid, which easily absorb moisture, the risk of bleed-out can be reduced without the process of flux rinsing, and sufficient reliability, especially reflow resistance after moisture absorption, can be secured.

From the viewpoint of metal oxide film removability, the weight fraction of the sulfide compound in the electrically conductive composition is preferably 1 to 10 wt %, and more preferably, is 2 to 5 wt %.

(Metal Particles)

As the metal particles, it is preferable that at least part of the metal particles contains one of Cu, Ag, Au, Ni, or Sn.

Further, it is preferable that at least part of the metal particles contain a combination that is capable of mutually forming an intermetallic compound, from the viewpoint of exerting heat resistance to temperatures higher than the mounting temperature after sintering, while decreasing the mounting temperature.

As such combination of metals, it is preferable that at least two are selected from Cu, Ag, Ni, Ti, Al, Sn, Zn, Au, and In. For example, the combination of Cu or Ni or Ag with Sn or Zn, the combination of Ag and Sn, the combination of Ni or Sn or Al with Ti, the combination of Au and In, etc., may be listed. However, in particular, from the viewpoint of lowering the mounting temperature, combinations that contain Sn, which has a low melting point, is preferable, and the combination of Cu or Ni with Sn is especially preferable.

In addition to the aforementioned combination of metals that enable the formation of intermetallic compounds, other metal components may be added as required. For example, by adding Zn, Bi, Ag, In, Ga, Pd, and such to Sn, alloying beforehand and using particles thereof, the melting point may further be lowered.

The weight ratio of the metal particles in the electrically conductive composition is preferably 70 to 96 wt %.

The metal particles preferably contain as little lead, mercury, antimony and arsenic as possible. Specifically, from the point of low environmental burden, it is preferable that their content in the electrically conductive composition is lower than 0.1 wt %.

Prior to sintering after the later-described dicing, by having a melting point that can be assigned to at least one metal component, which is observed as an endothermic peak by DSC, the component becomes spreadable on to the surface of the adherend, thus, making mounting at low temperature advantageous. Further, after sintering, the component undergoes intermetallic diffusion reaction, causing the melting point to rise. Thus, sufficient heat resistance is obtained, even when, for example, subjected to a wire bonding process by a high-melting point lead-free solder, or to a reflow process, after mounting. The mounting temperature is preferably 100 to 250° C., and more preferably, is 100 to 200° C. The heat resistance is preferably 250° C. or higher, and more preferably, is 300° C. or higher.

(Thermosetting Resin)

It is preferable that the electrically conductive composition of the present invention further contains a thermosetting resin. The thermosetting resin is effective in adding film-formation property prior to sintering and adding alleviative property against stress that occurs from the heat cycle after sintering.

From the viewpoint of heat resistance and film formation when the metal particles are mixed, the thermosetting resin preferably contains a maleic imide resin (maleimide resin) that contains two or more units of imide groups in one molecule, or an epoxy resin. The maleic imide resin can be obtained by, for example, subjecting maleic acid or an anhydride thereof and diamine or polyamine to condensation. However, from the viewpoint of stress relaxation, those that comprise structures derived from aliphatic amines of C10 or more are preferable. Those of C30 or more with structures as expressed by the following formula (2) are especially preferable.

[Chemical Formula 2]

General Formula (2)

The maleic imide resin may contain acid components other than maleic acid, such as structures derived from benzene tetracarboxylic acid or an anhydride thereof, hydroxyphthalic acid bis(ether) or an anhydride thereof, etc., in order to adjust the molecular weight or Tg. As the curing agent for the maleic imide resin, phenol resins, radical generators, etc. are preferable.

As a bismaleimide resin of such structure, for example, those expressed by the following structural formula may be listed.

[Chemical Formula 3]

-continued

Note that in the above formula, "$C_{36}$" refers to the following structure.

[Chemical Formula 4]

Further, it is preferable that the number average molecular weight of the maleic imide compound is 3000 or more.

When selecting epoxy as the thermosetting resin, from the viewpoint of balancing stress relaxation property and film-formation property, bisphenol A-type epoxy resins and bisphenol F-type epoxy resins, as well as combinations thereof, are preferable. More preferable are mixtures of those with phenoxy resins, which are large molecular weight epoxy resins. As the curing agent for the epoxy resin, acid anhydrides, phenol resins, amines, imidazoles, and dicyandiamides etc., may be selected.

By containing thermosetting resins that possess stress relaxation properties, the sintered body of the electrically conductive adhesive composition of the present invention overcomes the disadvantages of conventional metal-only lead-free solders, which were hard and brittle and thus showed poor thermal fatigue properties. Further, since its film-formation property prior to sintering is secured, it becomes especially suitable for the use in adhesive films.

When using the electrically conductive composition of the present invention as an adhesive, by being in film-form, for example, it can be fixed on the backside of a wafer on which a power semiconductor device is formed, then, divided along with the wafer in a dicing process, in which the wafer is divided into chips according to each device. Thus, the adhesive film can easily be mounted on the entire backside of the device without deficiency or excess, being impertinent to problems that arise from liquids, such as the wettability of the solder, or in other words, spreading and protrusion of the solder. Further, by adjusting the thickness of the adhesive film in advance, the height of the device after die bonding can be controlled with high accuracy, compared to conventional solders and electrically conductive pastes.

The electrically conductive adhesive film of the present invention is obtained by forming the electrically conductive composition of the present invention on a substrate in film-form. As the method of forming, various known methods, such as a method of applying a varnish, which is obtained by dissolving and dispersing the electrically conductive composition in a solvent, on a substrate and drying it thereafter, a melt-application method of melting the electrically conductive composition under high temperature and applying it on a substrate thereafter, a method of pressing the electrically conductive composition along with the substrate under high pressure, an extrusion method of melting the electrically conductive composition, extruding from an extruder, and extending thereafter, and a printing method of filling the above-described varnish in a screen mesh (screen printing) or a metallic printing plate (photogravure cylinder), may be listed. However, the method is not limited to such methods.

Further, by forming a dicing die bonding film by combining the electrically conductive composition of the present invention with a dicing tape, the adhesive film and dicing tape can be bonded on to the wafer at once, and thus, the process can be abbreviated.

The above embodiments will be described with reference to the Figures.

Figure 1:
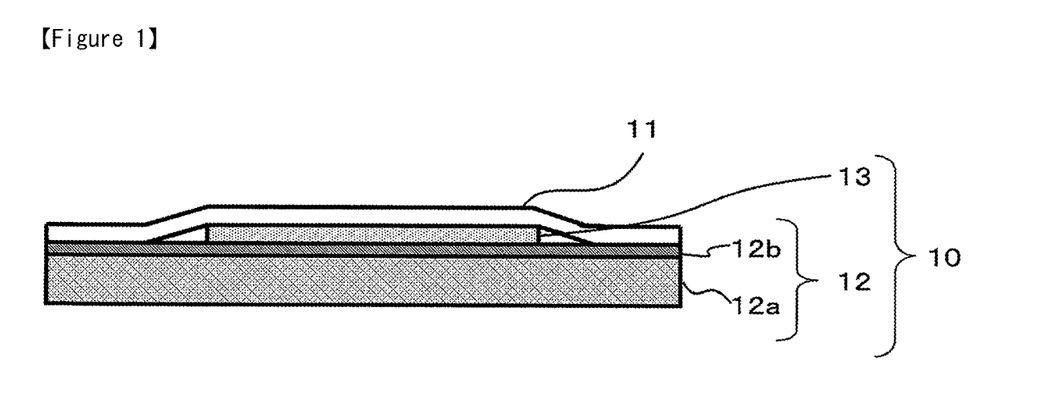
FIG. 1 is a sectional scheme of an embodiment of the dicing die bonding film of the present invention.

FIG. 1 is a sectional scheme of the dicing die bonding film 10 of the present invention. The dicing die bonding film 10 is mainly composed of a dicing tape 12 and an adhesive film 13. The dicing die bonding film 10 is one example of a semiconductor processing tape, and may be cut (pre-cut) to an arbitrary shape depending on the process or apparatus in which it is to be used, or may be cut for each semiconductor wafer, or may be in the form of a long roll.

The dicing tape 12 is composed of a supporting substrate 12a and a pressure-sensitive adhesive layer 12b formed thereon.

The release-treated PET 11 covers the dicing tape 12 and protects the pressure-sensitive adhesive layer 12b and the adhesive film 13.

It is preferable that the supporting substrate 12a is radiolucent. Specifically, plastics and rubbers are normally used, but any material may be used without limitation as long as it has radiolucency.

The base resin composition in the pressure-sensitive adhesive of the pressure-sensitive adhesive layer 12b is not particularly limited, and ordinary radiation-curable pressure-sensitive adhesives may be applied. Preferably, acrylic pressure-sensitive adhesive compositions, which contain functional groups that can react with isocyanate groups, such as a hydroxyl group, may be listed. In particular, although not limiting, an acrylic pressure-sensitive adhesive with an iodine value of 30 or lower, which comprises a radiation curable carbon-carbon double bond structure, is preferable.

As for the composition of the adhesive film 13 of the present invention, as described previously, it is extremely favorable that the electrically conductive adhesive film contains metal particles, a thermosetting resin, and a compound having Lewis acidity or a thermal acid generator, since excellent heat resistance and mounting reliability is obtained when bonding the semiconductor power device on to a metal lead frame, and since there is little burden on the environment.

(Method of Using Dicing Die Bonding Film)

In the production of semiconductor devices, the dicing die bonding film 10 of the present invention may be used favorably.

Figure 2:
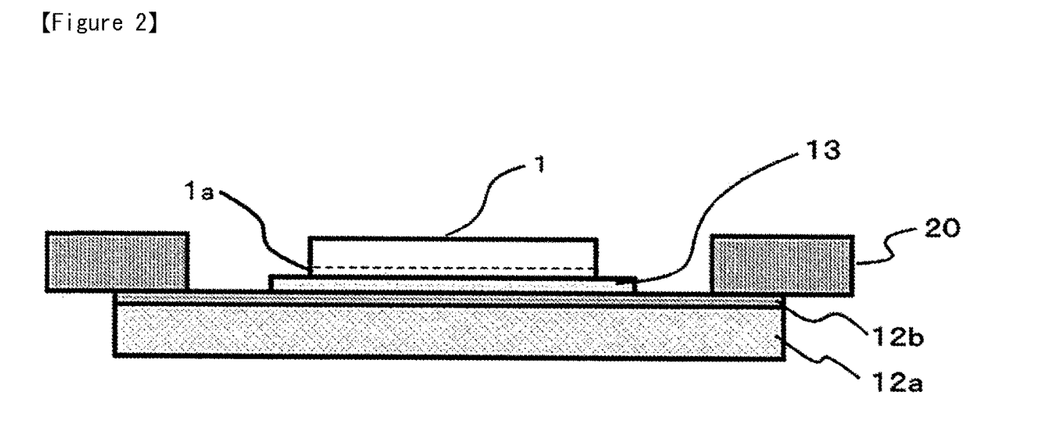
FIG. 2 is a scheme that shows a state in which the dicing die bonding film of the present invention is fixed on to a semiconductor.

First, the release-treated PET 11 is removed from the dicing die bonding film 10. Then, as shown in FIG. 2, the adhesive film 13 is affixed on to the semiconductor wafer 1, and the side part of the dicing tape 12 is fixed with the ring frame 20. The ring frame 20 is one example of a frame for dicing. The adhesive film 13 is laminated on to the part of the dicing tape 12 to which the semiconductor wafer 1 is bonded. There is no adhesive film 13 on the part of the dicing tape 12 that comes in contact with the ring frame 20.

Figure 3:
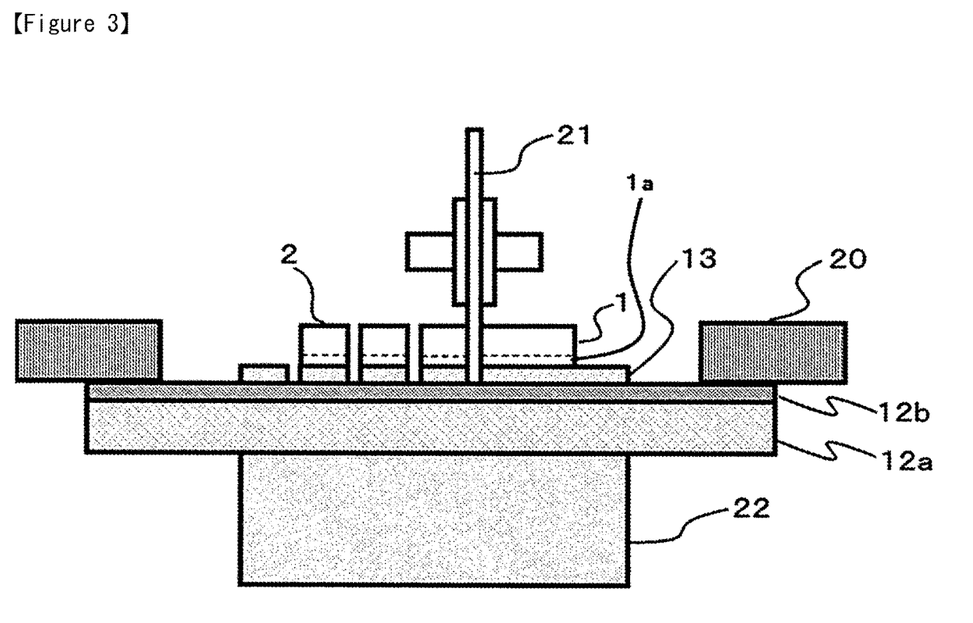
FIG. 3 is a scheme that describes the dicing process.

Subsequently, as shown in FIG. 3, the bottom side of the dicing tape 12 is fixed by suction on the suction table 22, while the semiconductor wafer 1 is divided in to a specified size using a dicing blade 21, to produce multiple semiconductor chips 2.

Figure 4:
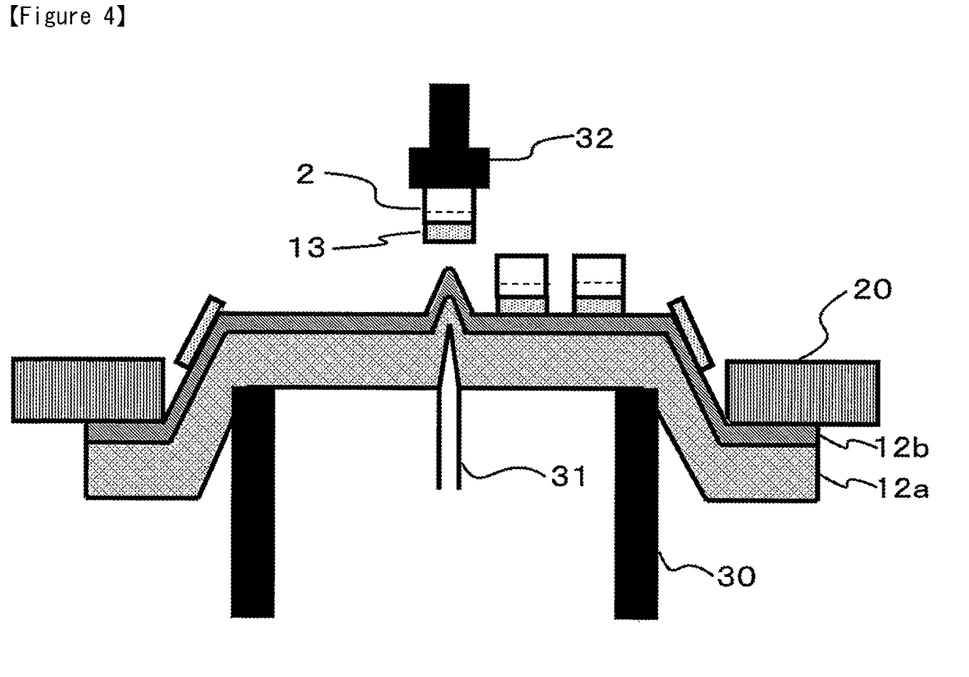
FIG. 4 is a scheme that describes the pickup process.

Subsequently, as shown in FIG. 4, while the dicing tape 12 is fixed by the ring frame 20, the tape push-up ring 30 is elevated, thereby bending the center part of the dicing tape 12 in an upward direction, while irradiating the dicing tape 12 with radiation such as ultra violet ray, to thereby weaken the adhesive strength of the dicing tape 12. Then, the push-up pin 31 is elevated at a position that corresponds to each of the semiconductor chip, to thereby pick up the semiconductor chip 2 by the suction collet 32.

Figure 5:
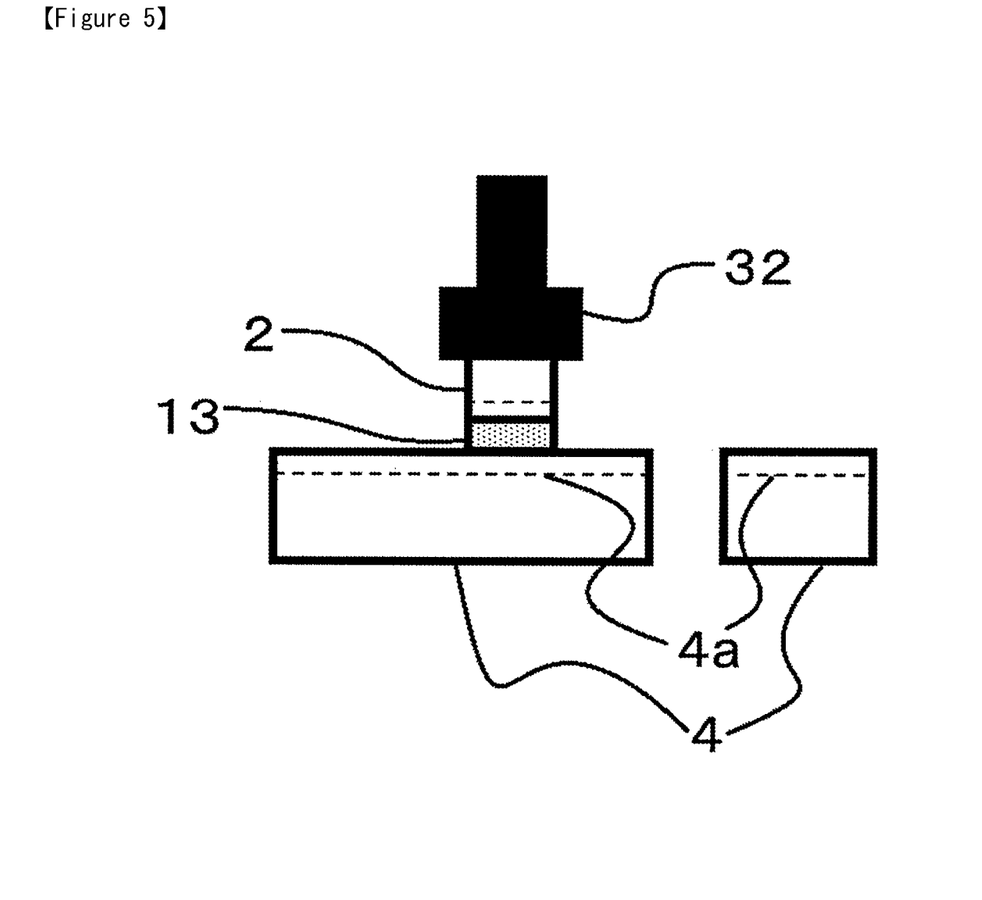
FIG. 5 is a scheme that describes the die bonding process.
Figure 6:
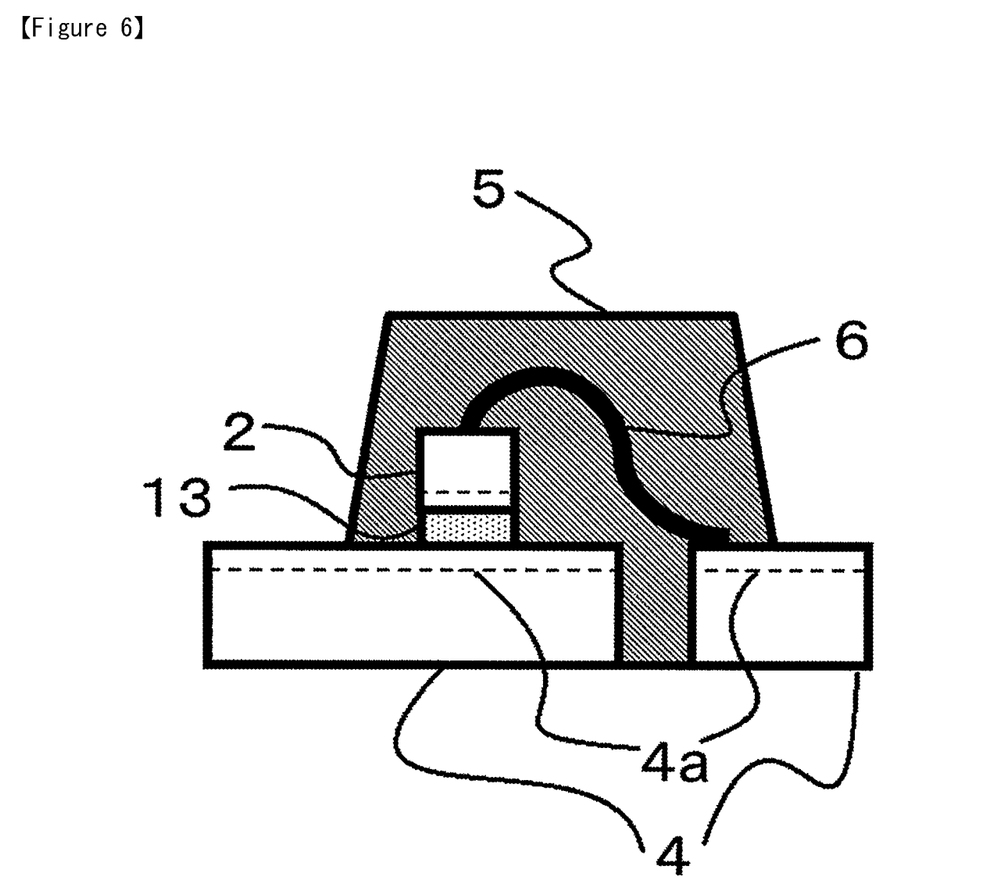
FIG. 6 is a scheme that shows the sectional view of a molded semiconductor device.

Subsequently, as shown in FIG. 5, the semiconductor chip 2 that was picked up is bonded on to the supporting member such as the lead frame 4 or another semiconductor chip 2 (die bonding process), and as shown in FIG. 6, by undergoing processes such as Al wire attachment, resin molding, thermosetting, and sintering, a semiconductor device is obtained.

(Electrically Conductive Paste)

In the above embodiments, an example of using the electrically conductive composition of the present invention as an electrically conductive adhesive composition in the form of an adhesive film 13 was described. However, by decreasing the amount of thermosetting resin that is mixed into the electrically conductive composition, or by not mixing the thermosetting resin, it can be used in the form of a paste that is useful as a solder and such. Specifically, by applying using screen printing or a dispenser, it may be used for the connection of electronic parts.

EXAMPLE

Hereinafter, the present invention will be described more specifically with reference to the Examples. However, the present invention is not limited in anyway by these Examples. Note that wt % indicates percent by weight.

Examples 1 to 4

To a mixture of 92 wt % of metal particles, 4.5 wt % of resin, and 3.5 wt % of flux, the composition of which is shown in Table 1, toluene was added to form a slurry and subjected to agitation by a planetary mixer. The slurry was then applied thinly on a release-treated PET and subjected to drying at 120° C., to obtain an adhesive film with a thickness of 40 μm. Further, in the Table, BMI-3000 refers to the following structure (n=1 to 10).

[Chemical Formula 5]

Comparative Examples 1, 2

Other than changing the composition of Table 1 to 85 wt % of metal particles, 8 wt % of resin, and 7 wt % of flux, adhesive films were produced by the same method as that described for the Examples.

<Supporting Substrate>

Commercially available resin beads composed of low density polyethylene (Novatec LL, product of Japan Polyethylene Corporation) were melted at 140° C. and formed into a long film with a thickness of 100 μm, using an extruder.

<Pressure-Sensitive Adhesive Composition>

A mixture of n-octyl acrylate, 2-hydroxyethyl acrylate, methacrylic acid, and benzoylperoxide as a polymerization initiator in the ratio of 200:10:5:2 (weight ratio) was dispersed in an appropriate amount of toluene. The reaction temperature and reaction time was adjusted to obtain an acrylic resin solution with a functional group. Next, to this acrylic resin solution, 2 parts by weight of Coronate L (product of Nippon Polyurethane Industry Co., Ltd.) was added as a polyisocyanate for 100 parts by weight of the acrylic resin solution. Further, an appropriate amount of toluene was added as additional solvent and agitated to obtain a pressure-sensitive adhesive composition 1.

<Dicing Tape>

Pressure-sensitive adhesive composition 1 was applied on to the supporting substrate so that the thickness of the pressure-sensitive adhesive composition after drying became 5 μm, which was then subjected to drying at 120° C. for 3 minutes to thereby prepare a dicing tape.

The adhesive tapes obtained in Examples 1 to 4 and Comparative Examples 1 and 2, as well as the dicing die bonding tapes obtained by fixing them with a dicing tape, were evaluated for the following items. The results are also shown in Table 1.

Volume Resistivity . . . Measured by the four-point probe method in conformity with JIS-K7194.

DSC . . . The presence or absence of an endothermic peak in the temperature range of 200 to 250° C. were confirmed for the samples before sintering, using a DSC measurement apparatus (DSC 7000, product of Hitachi High-Technologies Corporation). Next, the same measurements were performed after subjecting each sample to sintering by placing under nitrogen at 250° C. for 4 hours.

Adhesive Strength . . . By bonding the adhesive film with the dicing tape, a die bonding film was prepared. After bonding its backside to a Au-plated Si wafer at 100° C., and dicing to 5 mm×5 mm, diced chips with adhesive films were obtained. After die bonding on to a Ag-plated metal lead frame at 140° C., samples were prepared by sintering at 230° C. for 3 hours. These samples were subjected to a die shear measurement apparatus (4000 series, product of Arctek Corporation) to measure the shear adhesive strength at 260° C.

Adhesive Strength After TCT . . . The above samples were subjected to thermal cycle testing (TCT) treatment of (−40↔150° C.)×200 cycles, after which the shear adhesive strength at 260° C. was measured.

PKG Pealing after MSL-Lv1, Lv2, Lv3 . . . The same samples that were used for the measurement of adhesive strength were sealed by epoxy-based mold resins and subjected to MSL-Lv1, Lv2, Lv3 treatment (see Table 2) of absorption reflow test after moisture absorption in conformity with JEDEC J-STD-020D1 (lead-free solder base), after which they were observed by an ultrasonic image processor (SAT, product of Hitachi Power Solutions, Co. Ltd.) for the development of inner delamination.

TABLE 1

|  |  | Example 1 | Example 2 | Example 3 | Example 4 | Comparative Example 1 | Comparative Example 2 |
|---|---|---|---|---|---|---|---|
| Composition | Metal | Cu | Cu + SnBi alloy | ← | ← | ← | ← |
|  | Resin | Epoxy | Bismaleimide (C9) | Bismaleimide (C10) | Bismaleimide (C36) | Epoxy | Epoxy |
|  | Flux | Sulfide 1 | Sulfide 2 | Sulfide 3 | ← | Tetraethylene Glycol | Abietic Acid |
| Evaluation Result | Volume Resistivity $\mu\Omega \cdot cm$ | 5000 | 70 | 70 | 70 | 300 | 700 |
|  | Endothermic Peak Before Sintering | none | 139° C., 230° C. | ← | ← | 139° C., 230° C. | ← |
|  | Endothermic Peak After Sintering | none | none | none | none | none | none |
|  | Adhesive Strength (260° C.) Mpa | 6.9 | 11.5 | 18.3 | 20 | 10 | 10.1 |
|  | Adhesive Strength After TCT Mpa | 3.9 | 7.6 | 17.8 | 22.3 | 4 | 3.3 |
|  | PKG Pealing After MSL-Lv.1 | observed | none | none | none | observed | observed |
|  | PKG Pealing After MSL-Lv.2 | none | none | none | none | observed | observed |
|  | PKG Pealing After MSL-Lv.2 | none | none | none | none | observed | observed |

Cu: Copper Particulates (product of Mitsui Mining and Smelting Co., Ltd.)
SnBi alloy: Solder Particulates $Sn_{72}Bi_{28}$ (product of Mitsui Mining and Smelting Co., Ltd.)
Epoxy: 15:5:10:1 mixture of YD-128 + YD-013 + YP-50 (product of Nippon Steel and Sumikin Chemical) + 2PHZ (product of Shikoku Chemicals Corporation)
Bismaleimide C9 100:5 mixture of 1,6'-bismaleimide-(2,2,4-trimethyl)hexane + Perbutyl O (product of NOF Corporation)
C10 100:5 mixture of 1,10-bismaleimide-normaldecane + Perbutyl O
C36 100:5 mixture of BMI-3000 (product of Designer Molecules Inc.) + Perbutyl O
Sulfide 1 Phenyl sulfide Mw = 186.3
Sulfide 2 Thianthrene Mw = 216.3
Sulfide 3 Bis (4-methacryloylthiophenyl)sulfide Mw = 386.6

Note that in the table 1,
Cu: copper particulates (product of Mitsui Mining and Smelting Co., Ltd.)
SnBi alloy: solder particulates $Sn_{72}Bi_{28}$ (product of Mitsui Mining and Smelting Co., Ltd.)
Epoxy: 15:5:10:1 mixture of YD-128+YD-013+YP-50 (product of Nippon Steel and Sumikin Chemical)+2PHZ (product of Shikoku Chemicals Corporation)
Bismaleimide (C9): 100:5 mixture of 1,6'-bismaleimide-(2,2,4-trimethyl)hexane+perbutyl O (product of NOF Corporation)
Bismaleimide (C10): 100:5 mixture of 1,10-bismaleimide-normaldecane+perbutyl O (product of NOF Corporation)
Bismalemide C36: 100:5 mixture of BMI-3000 (product of Designer Molecules Inc.)+perbutyl O (product of NOF Corporation)
Sulfide 1: phenyl sulfide Mw=186.3
Sulfide 2: thianthrene Mw=216.3
Sulfide 3: Bis(4-methacryloylthiophenyl)sulfide Mw=386.6

TABLE 2

| MSL | Moisture Absorption Condition | Reflow Grade Temperature |
|---|---|---|
| Lv. 1 | 85° C.-85% RH × 168 h | 260° C. |
| Lv. 2 | 85° C.-60% RH × 168 h | 260° C. |
| Lv. 3 | 30° C.-60% RH × 192 h | 260° C. |

From the above results, it was confirmed that the electrically conductive adhesive films of Examples 1 to 4, which comprise metal particles and the sulfide compound expressed by general formula (1) as the flux, exert remarkable effects of high heat resistance, high moisture absorption reliability, and high bonding reliability, without the use of lead solder, which puts a large burden on the environment.

In particular, in Example 3, wherein a sulfide compound containing an acryloyl group is used as a flux, and in Example 4, wherein a maleic imide resin that contains a structure derived from an aliphatic amine of 30 carbons or more is used as the thermosetting resin, in addition to the use of a sulfide compound containing an acryloyl group, showed excellent performance.

In contrast, in Comparative Example 1, wherein tetraethylene glycol was used as the flux, and in Comparative Example 2, wherein abietic acid was used as the flux, neither of which are sulfide compounds, low adhesive strengths after TCT were observed. Further, since these samples tended to absorb moisture, inner delaminations were observed even after the MSL test, confirming that there are problems in moisture absorption reliability and bonding reliability. Furthermore, since abietic acid has a small equivalence per carboxylic acid mass, addition in relatively small amounts as that of the Example could not remove the oxide film. Thus, the oxide film became a barrier, and the diffusion reaction between the metals did not proceed, resulting in the endothermic peak remaining even after sintering.

DESCRIPTION OF NOTATIONS

1: semiconductor wafer
1a: backside Au plating layer
2: semiconductor chip
4: metal lead frame
4a: Ag plating layer
5: mold resin
6: Al wire
10: dicing die bonding film
11: release-treated PET
12: dicing tape
12a: supporting substrate
12b: pressure-sensitive adhesive layer
13: adhesive film
20: ring frame
21: dicing blade 22: suction stage
30: tape push-up ring
31: push-up pin
32: suction collet

The invention claimed is:

1. An electrically conductive composition, which comprises a sulfide compound expressed by the following general formula (1)

General Formula (1)

wherein R is an organic group that contains at least carbon; R' is an organic group that is the same as or different from R; R and R' may be bonded, and wherein the sulfide compound is a compound that contains at least one acryloyl group;
metal particles that contain at least one of Cu, Sn or Ni as essential components; and
a thermosetting resin, wherein the thermosetting resin comprises a maleic imide compound that contains two or more units of imide groups in one molecule.

2. The electrically conductive composition of claim 1, wherein the number average molecular weight of the sulfide compound is 200 or more.

3. The electrically conductive composition of claim 1, wherein the maleic imide compound contains a structure derived from an aliphatic amine of C10 or more.

4. The electrically conductive composition of claim 1, wherein the number average molecular weight of the maleic imide compound is 3000 or more.

5. An electrically conductive composition, which comprises a sulfide compound expressed by the following general formula (1)

General Formula (1)

wherein R is an organic group that contains at least carbon; R' is an organic group that is the same as or different from R; R and R' may be bonded, and wherein the sulfide compound is a compound that contains at least one acryloyl group;
metal particles that contain at least one of Cu, Sn or Ni as essential components; and
a thermosetting resin, wherein the thermosetting resin is an epoxy resin.

6. The electrically conductive composition of claim 1, wherein at least part of the metal particles contains one of Cu, Ag, Au, Ni, or Sn.

7. The electrically conductive composition of claim 1, wherein the metal particles are a mixture of two or more metals, which includes a combination that is capable of mutually forming intermetallic compounds.

8. The electrically conductive composition of claim 7, wherein at least two of the two or more metal particles are selected from the group consisting of Cu, Ag, Ni, Ti, Al, Sn, Zn, Au, and In.

9. The electrically conductive composition of claim 1, which comprises at least one endothermic peak observed by DSC (Differential Scanning calorimetry) at 100° C. to 250° C. prior to sintering, which becomes unobservable after sintering.

10. An electrically conductive adhesive composition, comprising the electrically conductive composition of claim 1.

11. An electrically conductive adhesive film, which is obtained by forming the electrically conductive adhesive composition of claim 10 on a substrate in film form.

12. A dicing die bonding film, which is obtained by bonding the electrically conductive adhesive film of claim 11 with a pressure-sensitive adhesive tape.

13. The electrically conductive composition of claim 1, wherein the sulfide compound further is a compound that contains two or more sulfur atoms in one molecule.

* * * * *